United States Patent
Thain et al.

(10) Patent No.: US 9,507,063 B2
(45) Date of Patent: Nov. 29, 2016

(54) ANTI-REFLECTING COVERING STRUCTURE WITH A DIFFRACTION GRATING USING RESONANT ELEMENTS

(71) Applicant: EUROPEAN AERONAUTIC DEFENCE AND SPACE COMPANY EADS FRANCE, Paris (FR)

(72) Inventors: Andrew Thain, L'Isle Jourdain (FR); Gilles Peres, Toulouse (FR)

(73) Assignee: European Aeronautic Defence and Space Company (EADS FRANCE) (FR)

(*) Notice: Subject to any disclaimer, the term of this patent is extended or adjusted under 35 U.S.C. 154(b) by 169 days.

(21) Appl. No.: 14/362,149

(22) PCT Filed: Dec. 4, 2012

(86) PCT No.: PCT/EP2012/074382
§ 371 (c)(1),
(2) Date: Jun. 2, 2014

(87) PCT Pub. No.: WO2013/083572
PCT Pub. Date: Jun. 13, 2013

(65) Prior Publication Data
US 2014/0320964 A1    Oct. 30, 2014

(30) Foreign Application Priority Data
Dec. 6, 2011  (FR) .................... 11 61242

(51) Int. Cl.
| H01Q 15/02 | (2006.01) |
| G02B 5/18 | (2006.01) |
| H01Q 1/52 | (2006.01) |
| H01Q 15/14 | (2006.01) |
| H05K 9/00 | (2006.01) |
| E04F 13/08 | (2006.01) |

(52) U.S. Cl.
CPC ............. *G02B 5/18* (2013.01); *E04F 13/0871* (2013.01); *H01Q 1/52* (2013.01); *H01Q 15/14* (2013.01); *H05K 9/0001* (2013.01); *H05K 9/0052* (2013.01)

(58) Field of Classification Search
CPC ....................................... H01Q 15/02
USPC ......................... 343/909; 342/4, 6
See application file for complete search history.

(56) References Cited

U.S. PATENT DOCUMENTS

| 3,538,663 A | 11/1970 | MacLeod |
| 4,118,704 A * | 10/1978 | Ishino ............... H01Q 17/008 342/4 |

(Continued)

FOREIGN PATENT DOCUMENTS

DE    102008059018    5/2010

OTHER PUBLICATIONS

International Search Report, Application No. PCT/EP2012/074382, dated Jan. 3, 2013 (2 pages).

*Primary Examiner* — Huedung Mancuso
(74) *Attorney, Agent, or Firm* — Perman & Green, LLP

(57) ABSTRACT

A diffractive device for fitting to a façade of a building, or to any other reflective wall, exposed to electromagnetic radiation emitted by a source located at a distance from the building, the device including a plurality of tubular resonant elements arranged on the façade of the building, where the resonant elements are arranged in a substantially parallel manner on the façade of the building in such a way as to form a diffraction grating and are oriented in a substantially perpendicular direction to the plane defined by the propagation vectors of the incident and reflected electromagnetic waves, each resonant element being configured to form an LC resonator capable of re-radiating a wave corresponding to the incident wave affected by a phase shift; the set of resonant elements being arranged in such a way that the incident wave is diffracted in a preferential direction.

14 Claims, 6 Drawing Sheets

(56) References Cited

U.S. PATENT DOCUMENTS

| | | |
|---|---|---|
| 5,057,842 A | 10/1991 | Moller et al. |
| 5,204,680 A * | 4/1993 | Allington ............... H01Q 15/14 342/4 |
| 5,353,029 A * | 10/1994 | Johnston ............... H01Q 17/00 342/1 |

* cited by examiner

ANTI-REFLECTING COVERING STRUCTURE WITH A DIFFRACTION GRATING USING RESONANT ELEMENTS

CROSS-REFERENCE TO RELATED APPLICATIONS

This application is the National Stage of International Application No. PCT/EP2012/074382 having International filing date 4 Dec. 2012, which designated the United States of America, and which International Application was published under PCT Article 21 (s) as WO Publication 2013/083572 A1 and which claims priority from, and benefit of, French Application No. 1161242 filed on 6 Dec. 2011, the disclosures of which are incorporated herein by reference in their entireties.

BACKGROUND

The aspects of the disclosed embodiment relate to the general field of the reflection of electromagnetic waves, particularly radio waves, and more particularly the field of preventing the effects of radio waves reflected by structures such as the facades of buildings on the space surrounding these structures. In particular, it concerns the effects of radio waves reflected by buildings located in airport zones on the proper operation of radio measurement systems.

In the context of the planning of airport zones, a major problem is that of determining the best way of siting the buildings required for the operation of the airport services, with the aim of minimizing the indirect effects of this siting on radio-sensitive areas. This is because these structures generally have large facades, which act as reflectors of the radio waves transmitted by the various transmission sources present in the vicinity of the airport zone or within this zone. In some cases, the reflection by the facade of a building of the radio transmission produced by a source which may or may not be distant from the building can prove extremely troublesome, insofar as the signal received by the facade is reflected toward an area where it will interfere with the radio transmissions taking place in this area. This is the case, in particular, if a building located in an area relatively close to a landing runway reflects toward the runway a radio transmission whose frequency band is located in the band occupied by transmissions of the landing system (ILS), particularly the band occupied by the "localizer" (providing radio alignment on the runway axis). This parasitic reflection, if strong enough, may affect the localizer signal and consequently disrupt the alignment of landing aircraft on the runway axis.

Because of the presence of numerous radio sources, notably the ILS antennas themselves, the problem of parasitic reflections from buildings is a major problem which is usually resolved by drawing up a siting plan including areas, notably those areas that are relatively close to the runways, where the location of any structure of significant size is prohibited. Taking into consideration, notably, the concentration of urban development and the desire to locate airport zones relatively close to urban areas, it becomes increasingly necessary to maximize the level of occupation of airport zones in terms of surface area. It is therefore more urgent than ever to find a solution to the problems of parasitic reflections of radio signals in sensitive directions.

According to the known prior art in this field, the facades of buildings which may accidentally give rise to parasitic reflections in sensitive directions may theoretically be equipped with patch structures, the purpose of which is to create, together with the wall on which they are installed, a diffraction device for reflecting incident waves, transmitted by external electromagnetic sources, in a preferred direction, which avoids the creation of interference in a sensitive area. A structure of this type is generally composed of conductive elongate structural elements arranged so as to form ribs spaced apart from each other. The ribs are generally tubular elements having a specified thickness such that a given value of phase shift is created between the wave directly reflected by the wall of the building and that reflected by the ribs. In this way, a diffraction grating of the Bragg grating type is formed, enabling the incident wave to be diffracted in a desired direction, according to the phase shift created by the ribs of the diffraction device.

According to the wavelength $\lambda$ whose reflection in a given direction is to be prevented, the ribs forming the covering have a given thickness h, which may be relatively large if the wave in question has a frequency of the order of hundreds of megahertz. Because of their bulky nature, these elements are difficult to position on the surface of a facade, especially if the elements are installed after the construction of the building.

Furthermore, in order to ensure the correct diffraction of the incident wave, the facade exposed to the radiation whose effects are to be prevented is, in most cases, preferably equipped with ribs having a length substantially equal to the height of the facade, or occupying a significant portion of the upper of the facade. The fixing of the structural elements on the facade in question therefore creates a heavy load on the facade, attempts being made to minimize this load by using hollow tube-shaped structural elements. However, these elements are fragile objects, and suffer from the weakness of a lack of intrinsic rigidity.

Thus, the well-known types of prior art coverings use structural elements, the mounting of which on the facade to be equipped is relatively demanding in terms of their size, or more precisely their overall dimensions, and in terms of their weight, which is supported by the facade, and of the rigidity of the resulting structure.

SUMMARY

One aspect of the disclosed embodiment is to propose an alternative structure to form a diffraction grating of the Bragg grating type. This structure is composed of tubular structural elements which, for the frequency band concerned, have an intrinsic rigidity greater than that of rectangular section elements, together with a substantially lesser thickness and width than those of elements forming the known structures.

For this purpose, the disclosed embodiment proposes a diffraction device for covering a facade of a building, or any other reflecting wall, exposed to the electromagnetic radiation transmitted by a distant source, the device including a plurality of tubular resonant elements, positioned in a periodic manner and in a substantially parallel way on the facade of the building so as to form a diffraction grating. Each resonant element forms an LC resonator configured to re-radiate a wave corresponding to the incident wave subjected to a phase shift. These resonant elements are arranged on the wall in such a way that the incident wave is diffracted in a preferred direction. The resonant elements are also oriented in a direction substantially perpendicular to the plane defined by the propagation vectors of the incident and reflected waves.

According to a specific aspect of the device, the spacing pitch of the different conductive elements is determined as a function of the wavelength λ and the angle of incidence e so as to create a diffraction grating of the Bragg grating type, producing a phase shift of the incident wave such that the latter is diffracted in a preferred direction.

According to the disclosed embodiment, if the electromagnetic transmission source is distant, the spacing between the different conductive elements is constant along the wall.

According to the disclosed embodiment, if the electromagnetic transmission source is nearby, the spacing between the different conductive elements is a function of the local angle of incidence of the electromagnetic wave.

According to the disclosed embodiment, each resonant element is composed of a tube of conductive material whose wall, which defines an inner cavity, has a longitudinal opening. The dimensions and geometry of the cavity defined by the wall, as well as the width of the longitudinal opening formed in this wall, are defined so that the element acts, in electromagnetic terms, as an LC resonator with a resonance frequency $F_0$ and a bandwidth $\Delta F_0$.

Additionally, according to the disclosed embodiment, each resonant element is preferably configured so as to have overall dimensions which can be inscribed within a parallelepipedal volume of given dimensions taking mechanical stresses into account.

According to the disclosed embodiment, the resonant elements forming the device may have cross sections of various polygonal shapes which are all inscribed in a rectangle, the resonant elements having specific values of capacitance or inductance according to the chosen cross section.

In a specific aspect, the wall of a resonant element has the shape, in cross section, of a rectangle, one length of which has a discontinuity limited by two segments substantially perpendicular to said length, whose ends are directed toward the inside of the perimeter.

Additionally, according to the disclosed embodiment, each resonant element may be configured so as to form a plurality of adjoining tubular cavities.

In a specific aspect, each resonant element is itself formed by a plurality of juxtaposed resonant elements, whose lateral walls are in electrical contact.

In a specific aspect, the inner volume of the resonant elements is empty.

Alternatively, in another apsect, the cavity defined by the wall of the resonant element is filled with a dielectric material chosen so as to reinforce the rigidity of the element.

According to a variant of this aspect, the cavity defined by the wall of the resonant element is filled with two superimposed layers of dielectric material, a conductive strip being placed in the cavity, at the interface between the two layers, facing the longitudinal slit formed along the wall.

Alternatively, in another aspect, the cavity defined by the wall of the resonant element is filled with a nonconducting ferromagnetic material chosen so as to increase the bandwidth $\Delta F_0$ and reduce the frequency $F_0$ of the resonant cavity.

Alternatively, in another aspect, the cavity defined by the wall of the resonant element is filled with a dielectric material having a high permittivity ε, chosen so as to reduce the frequency $F_0$ of the resonant cavity.

BRIEF DESCRIPTION OF THE DRAWINGS

The characteristics and advantages of the disclosed embodiment will be made more clearly evident by the following description which is based on the appended drawings, which show.

DETAILED DESCRIPTION

Figure 1:
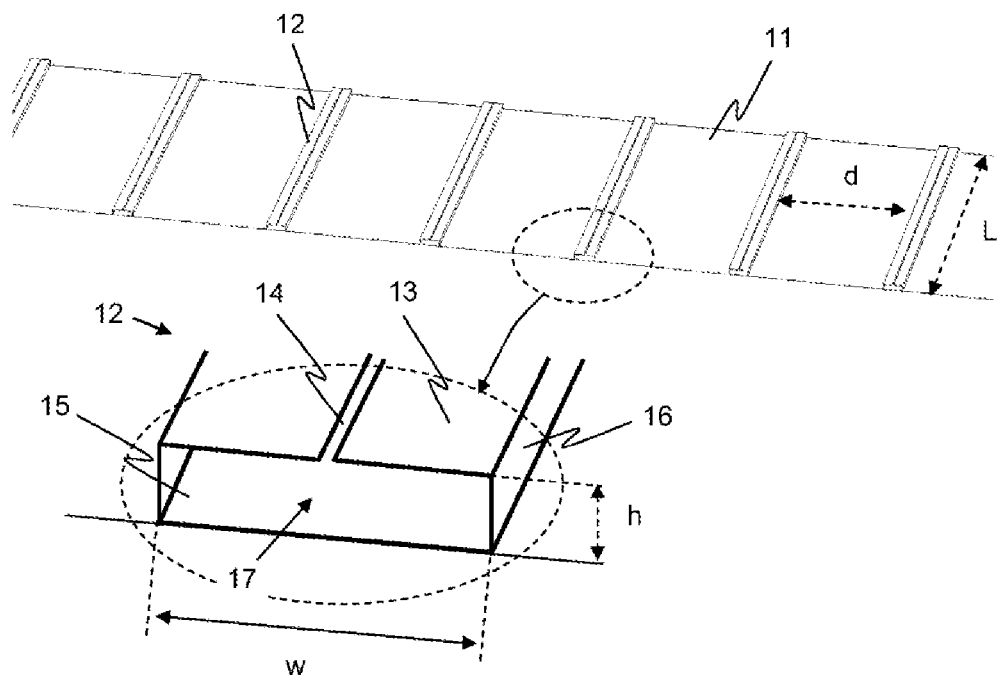
FIG. 1, a schematic representation of the whole of the device according to the disclosed embodiment.
Figure 2:
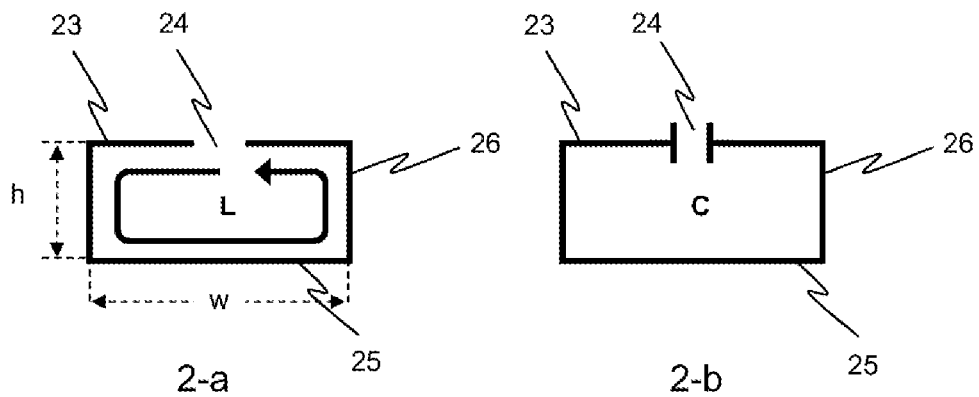
FIG. 2, an equivalent diagram of the operation of a structural element forming the device according to the disclosed embodiment.

FIGS. 1 and 2 show the general structure of the device according to the disclosed embodiment. As shown in FIG. 1, the covering according to the disclosed embodiment takes the form of an arrangement of parallel elongate structural elements 12 whose length depends on the dimensions of the wall 11 to be covered.

The structural elements 12 are arranged on the wall 11 so as to form a diffraction grating having a pitch d. According to the disclosed embodiment, the spacing pitch d of the different conductive elements is conventionally determined as a function of the wavelength λ and the angle of incidence θ so as to create a diffraction grating, producing a phase shift of the incident wave such that the latter is diffracted in a preferred direction. Depending on whether or not the source of the radio transmission received by the wall is considered to be a distant source, the pitch d is a constant pitch, as in FIG. 1, or a pitch varying as a function of the local angle of incidence of the electromagnetic wave.

The structural elements 12 are also arranged on the wall 11 so as to be oriented in a direction substantially perpendicular to the plane defined by the propagation vectors of the incident and reflected waves. Thus, in the specific case of a building facade, the structural elements are positioned vertically.

According to the disclosed embodiment, each structural element 12 is a conductive element in the form of a hollow cylinder or tube, of polygonal shape, having a flat face 15 by which it is fixed to the wall 11, the wall of the tube being provided, on the opposite face 13, with a longitudinal slit 14 having a given width e. The structural elements 12 are made from a conductive material, such that they form L-C (i.e. inductance-capacitance) circuits with distributed constant L and C. The inductance L is formed by the wall of the tube itself and is a function of the area delimited by the wall of the tube, while the capacitance C is formed by the slit 14 and by the cavity 21.

The dimensions of the wall of the tube are also determined in such a way that the values of the inductance L and the capacitance C make it possible to form an equivalent resonant circuit having a resonance frequency $F_0$ and a bandwidth $\Delta F_0$ defined in a known way by the following relations:

$$F_0 \propto \frac{1}{\sqrt{L \cdot C}} \quad [1]$$

and $$\Delta F_0 \propto \sqrt{\frac{L}{C}} \quad [2]$$

In terms of operation, each resonant element is configured or designed in such a way that, when it is illuminated by an incident radio wave, it produces a radio wave having the same frequency but subjected to a given phase shift, so that the combination of the waves reflected by the different structural elements 12 and the waves directly reflected by the portions of the wall 11 located between these structural elements forms a wave diffracted in the desired direction.

The device according to the disclosed embodiment therefore acts as a conventional diffraction grating of the Bragg grating type, having simply conducting structural elements. In terms of dimensions, however, the structural elements constituting the device can be used to form a covering which is advantageously easier to install on a wall, particularly on a wall of a building.

This is because, unlike the dimensions of the conductive elements forming a conventional diffraction grating, the dimensions of the resonant elements which form the device according to the disclosed embodiment are not directly a function of the path difference to be created between the waves reflected by the wall 11 itself and those reflected by the structural elements to obtain the desired diffraction, but are affected by the values of capacitance and inductance to be obtained.

Consequently, for the same result, that is to say for the same phase shift between the waves reflected by the wall 11 itself and those reflected by the structural elements, the dimensions of the resonant element are substantially smaller than those of a simple conductive element.

Figure 9:
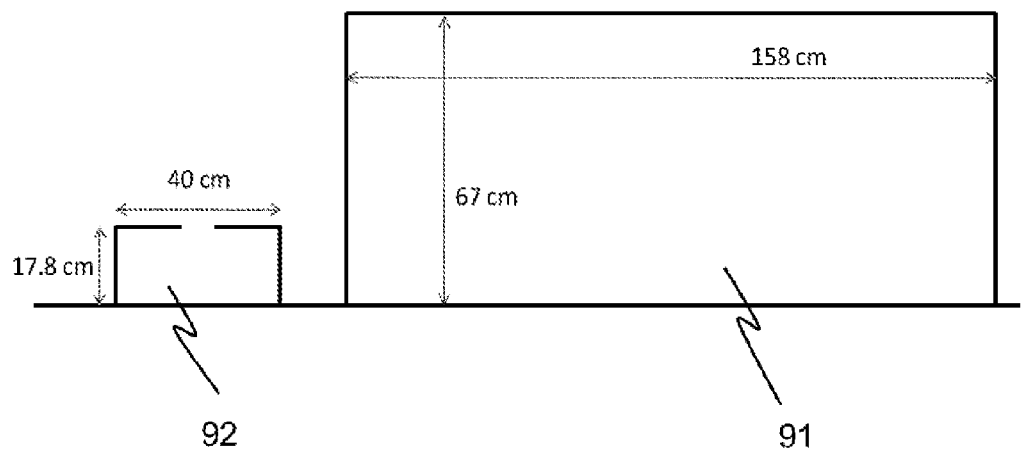
FIG. 9, an illustration highlighting the advantageous nature of the device according to the disclosed embodiment in terms of size.

FIG. 9 illustrates this structural advantage by showing the respective dimensions of the structural elements forming two diffraction gratings intended to control the wave reflected by a wall illuminated at an incidence of approximately 25° by a radio wave having a frequency of about a hundred megahertz transmitted by a distant source, that is to say a source located at a distance from the wall such that the wave received by the facade 10 of the building is a plane wave (Fraunhofer zone). In both cases, gratings formed by structural elements with a rectangular cross section are considered. The first grating 91 is a conventional grating formed by simple conductive elements, whereas the second grating 92 is a device according to the disclosed embodiment, formed by resonant elements 12. As may be seen in the figure, the same result, namely the production of a phase shifted wave, is achieved with dimensions of a resonant element 12 very substantially smaller than those of a simple conductive element.

This dimensional characteristic provides two advantages. The first advantage is ergonomic, and consists in the fact that, when mounted on a wall, the diffraction device according to the disclosed embodiment appears less prominent and less masking, so that, if the wall is a facade with windows, the exterior light penetrates into the building more easily. The second advantage is mechanical, and consists in the fact that, since the resonant elements have smaller dimensions, the problem of their intrinsic rigidity and their possible deformation under the effect of their own weight is less acute when they are mounted on the wall 11 to be covered.

The following text describes different variant aspects of the resonant elements forming the device according to the disclosed embodiment, in which the structural elements have cross sections of various shapes. These different variant aspects are described here with the aim of demonstrating that, for given overall dimensions, it is possible to produce resonant elements having different resonance frequencies $F_0$ and bandwidths $\Delta F_0$.

To provide a clear demonstration of the comparative advantages of the different variants, the structural elements considered here are those whose cross sections form quadrilaterals which can be inscribed the same rectangle having a given length w and width h. It should be noted that the variant aspects described below do not in any way limit the form, purpose or scope of the disclosed embodiment.

According to a first simple variant aspect, each tube has, as shown in FIG. 2, a rectangular cross section with two rectilinear opposing longer sides 23 and 25, having a length w, corresponding respectively to the inner face 15 and the outer face 13, and two shorter sides 26, with a length of h, corresponding to the lateral faces 16. The side 13 also has a discontinuity 24 corresponding to the slit 14. In this variant embodiment, the value of the inductance L is notably determined by the area defined by the wall of the tube. Regarding the value of the capacitance C, this is determined by the width of the slit 14 which corresponds, in the cross-sectional view, to the discontinuity 24, and by the dimensions of the inner space delimited by the wall of the element (see illustration 2-b).

Figure 3:
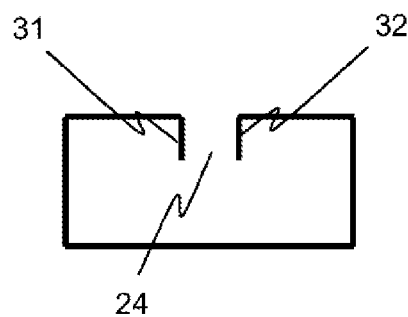
FIGS. 3 to 8, illustrations of different variant aspects of the device according to the disclosed embodiment.

According to a second variant aspect, each resonant element has a cross section such as that shown in FIG. 3, in which the wall of the element 12 has, along the slit 14, corresponding to the discontinuity 24 in the cross section, two edges curved inward at 90° and facing each other, represented by two segments of identical length 31 and 32. These two edges have lengths defined in such a way as to increase the value of the capacitance C with respect to that of the preceding variant, and to make this capacitance C less dependent on the size of the cavity (plane capacitor).

Figure 4:
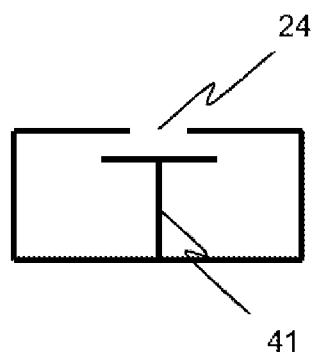

According to a third variant aspect, shown in FIG. 4, the resonant elements 12 that are used have, in section, a rectangular cross section, one of the lengths of which has a discontinuity 24 corresponding to the slit 14. However, the cavity 17, defined by the wall of the resonant element 11, accommodates an inner extension 41, fixed to the face of the wall 15 opposite the wall 13 including the slit 14, and forming a rib 41 projecting inside the cavity.

In this variant aspect, this rib 41 has, in cross section, a "T" shape, the bar of which is parallel to the lengths 23 and 25 of the rectangle representing the section of the element. It is configured and arranged within the cavity in such a way that the bar of the "T" is placed facing the discontinuity 24, at a distance defined as a function of the expected resonance frequency $F_0$ and bandwidth $\Delta F_0$. This configuration advantageously enables the value of the capacitance C to be increased substantially without any substantial modification of the value of the inductance L.

Figure 5:
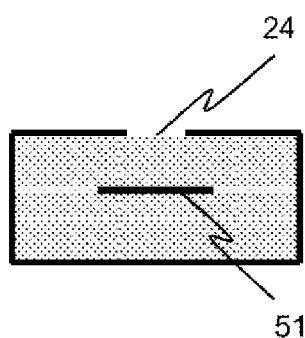

According to a fourth variant aspect, shown in FIG. 5, the cavity of the resonant elements 12 that are used does not simply contain ambient air, but is filled with a dielectric material 51 which, in this case, essentially serves to reinforce the mechanical rigidity of the element. This variant is particularly advantageous if the element used is very long relative to the dimensions of the wall to be covered.

It should be noted that, in this variant aspect, the material accommodated in the cavity may also have diverse electromagnetic properties. Thus, by using a material having a high permittivity ϵr, it is possible to increase the value of the capacitance C, without changing the dimensions of the cavity or the shape of the wall. Conversely, by using a material having a high permeability μr, the value of the inductance L can be increased without making any other changes.

It should also be noted that this variant aspect may be associated with all the preceding variants. It may, in particular, include the positioning in the material of a longitudinal strip 52 arranged so as to face the slit 14. This produces a radiating element which is very similar in its design to the element of the fourth variant embodiment described above.

Figure 6:
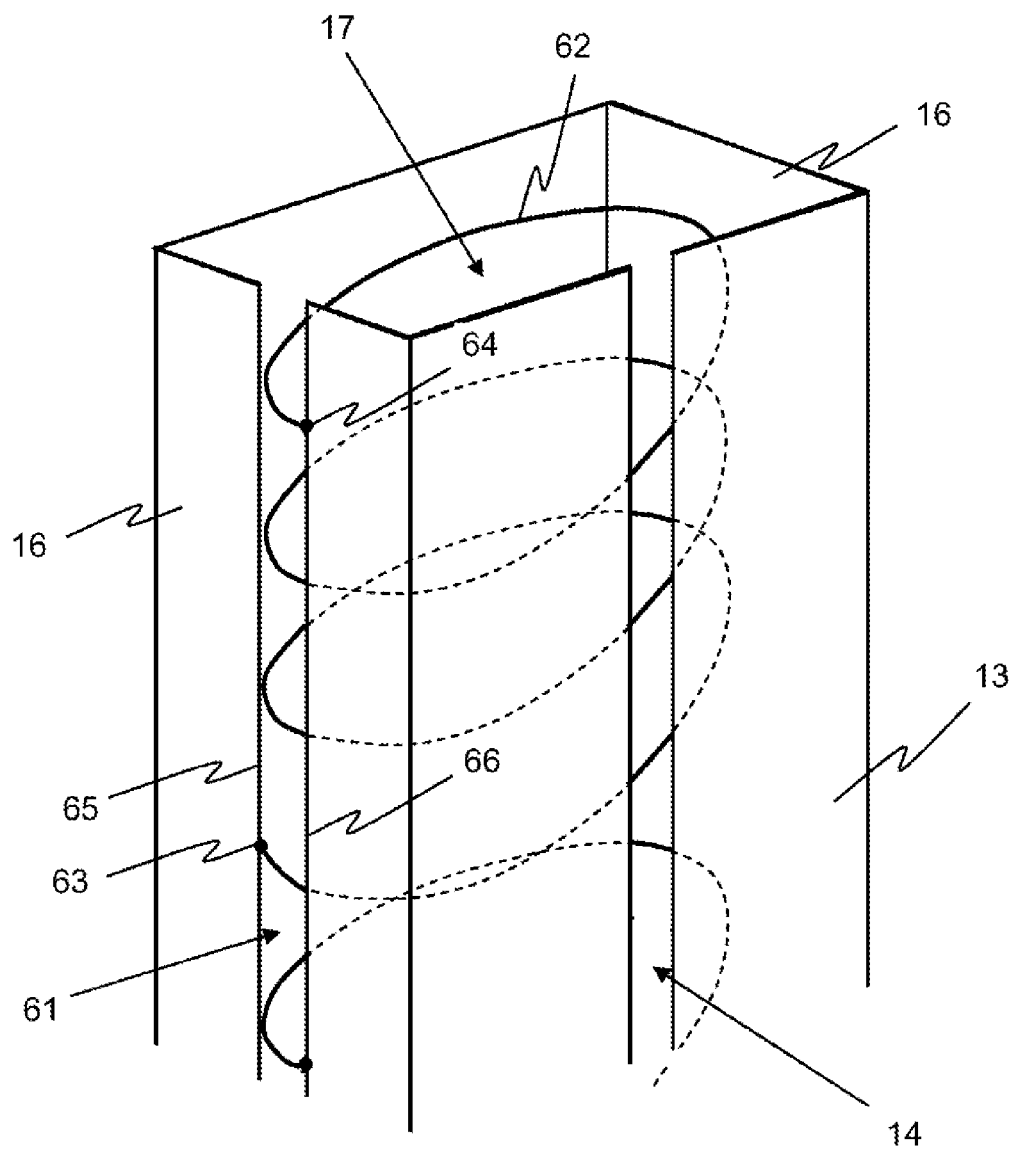

According to a fifth variant aspect, shown in FIG. 6, a slit 61 is formed on one of the lateral faces 16 of the resonator, the assembly being held in place by an appropriate dielectric mechanical structure, which is omitted from the figure for the sake of clarity. An element 62 having high self-inductance is also placed within the cavity 17, and is connected electrically by each of its ends 63 and 64 to the two edges 65 and 66 of the slit 61. Thus the inductance of the circuit LC is increased, resulting in a decrease in its resonance frequency $F_0$ and an increase in its bandwidth $\Delta F_0$.

In terms of construction, the element 62 may consist of a single assembly extending over the whole length of the cavity 17, or, as shown in FIG. 6, may consist of a plurality of elements arranged in sequence with each other, each element being connected by its ends to the edges of the slit 61.

Figure 7:
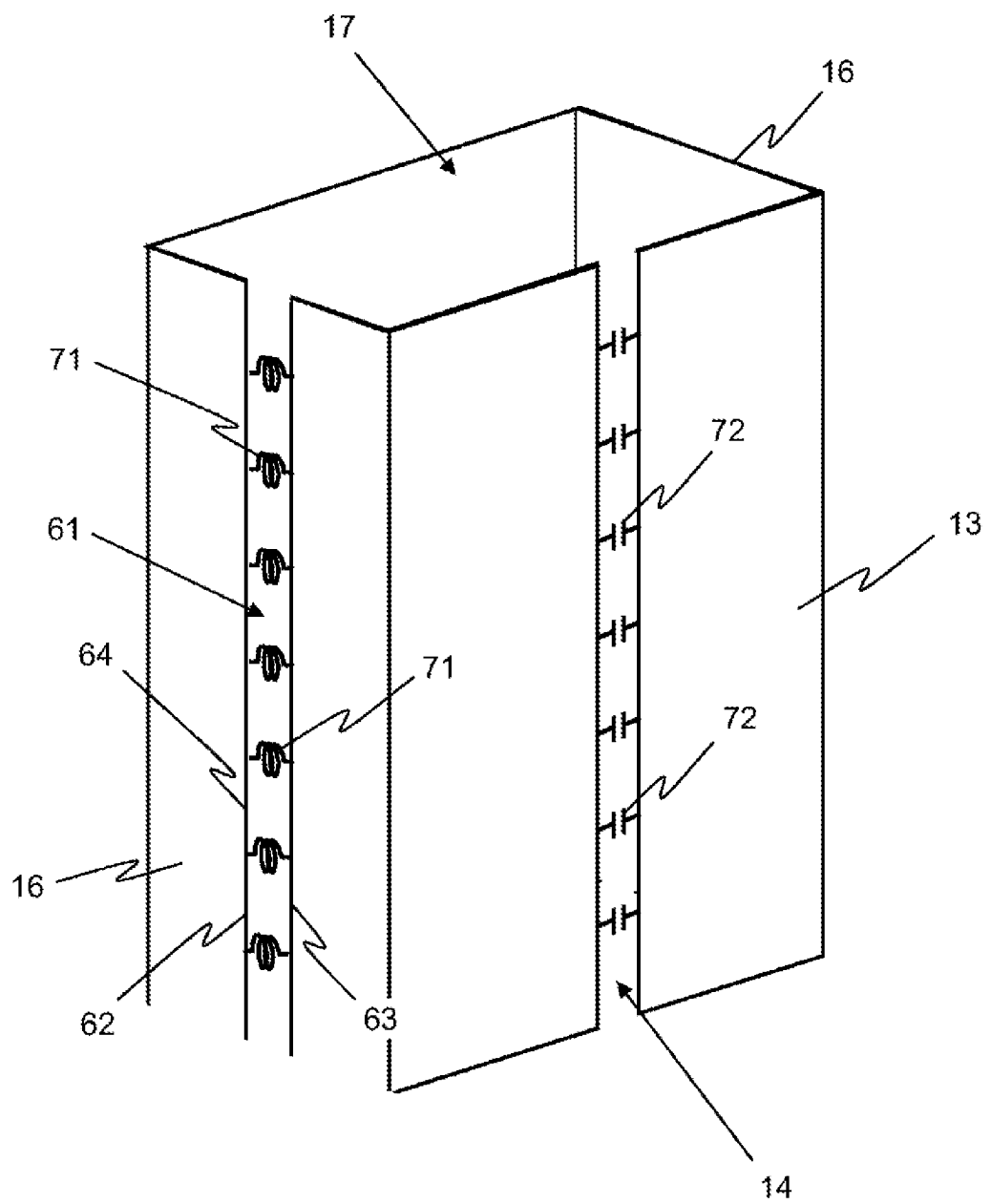

According to a sixth variant aspect, shown in FIG. 7, each resonant element has a slit 61 formed on one of the lateral faces 16 of the resonator, together with separate inductances 71, which are preferably distributed over the whole length of the slit and each of which has its terminals connected to the two edges 65 and 66 of the slit 61. As in the previous case, this arrangement increases the inductance of the circuit LC, resulting in a decrease in its resonance frequency $F_0$ and an increase in its bandwidth $\Delta F_0$. Additionally, and optionally, each resonant element may have separate capacitive elements 72 which are fitted, preferably, along the whole of the slit 14, and which have their terminals connected to the edges of this slit.

Figure 8:
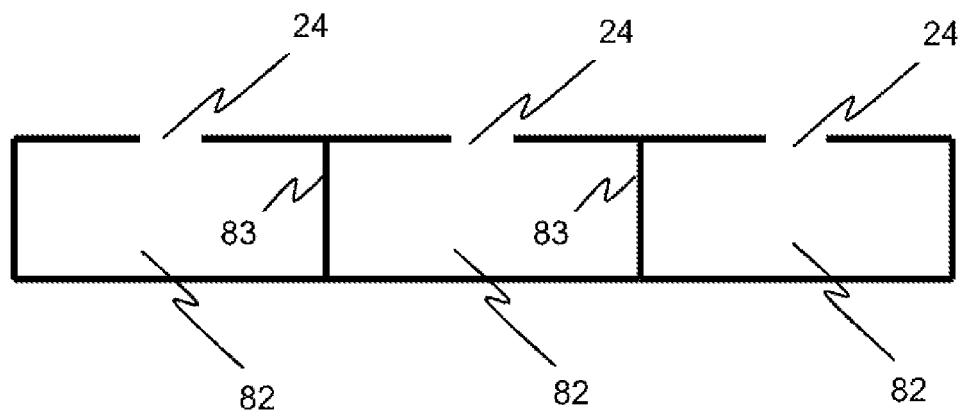

According to a seventh variant aspect, shown in FIG. 8, each resonant element making up the device according to the disclosed embodiment consists of two or more elementary resonant elements 11 as described above. Each elementary resonant element is configured so as to have a given resonance frequency $F_0$ and a given bandwidth $\Delta F_0$, $F_0$ and $\Delta F_0$ generally being the same for all the associated resonant elements.

This arrangement of adjacent resonant elements tuned to the same frequency $F_0$ has the notable advantage of increasing the power re-radiated by the resonant element, given that, in a known way, the value of the re-radiated power depends mainly on the dimensions (particularly the width w) of the face of the resonant element that includes the slit 14. Thus, by juxtaposing two or more elementary resonant elements, the power retransmitted by the device is substantially increased, without any notable change in the operating parameters of the resonant circuit itself.

In a simple aspect, shown in FIG. 8, the composite elements formed in this way may be made from a single tubular structure 81 with a rectangular cross section, the inner cavity of which is separated into elementary cavities 82 by intermediate partitions 83, each elementary cavity 82 being provided with a longitudinal slit represented by the discontinuities 84 in the sectional view of FIG. 7.

Thus, as may be gathered from the aspects described in the preceding text, the device according to the disclosed embodiment proposes, for the construction of the covering of a wall subjected to a radio transmission whose reflection in a given direction is to be avoided, a solution which is an advantageous alternative, in terms of both installation and operation, to the use of diffraction gratings with simple conductive structural elements according to the prior art.

Figure 10:
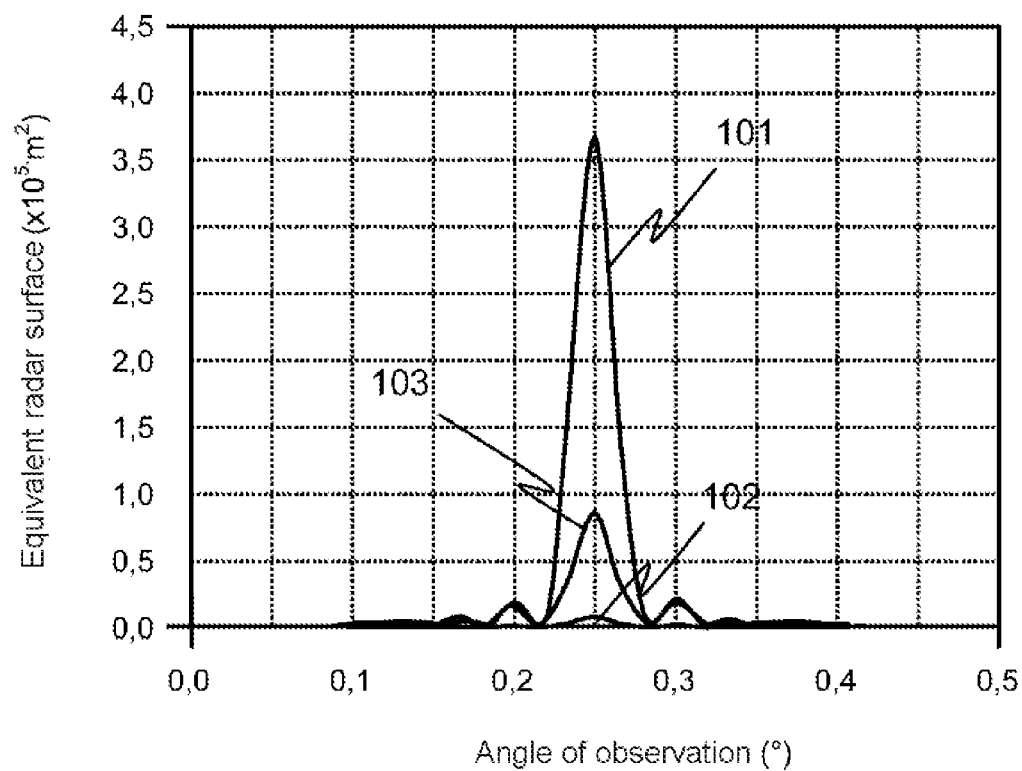
FIG. 10, a curve illustrating the advantages gained by the use of the device according to the disclosed embodiment.

FIG. 10 shows, in a single frame of reference (angle of observation and equivalent surface of the wall), the radar equivalent surface curves for a wall formed by the facade of a building, relating to three states, namely a first state (curve 101) corresponding to a bare wall, a second state (curve 102) corresponding to a wall covered with a diffraction grating according to the prior art, and a third state (curve 103) corresponding to a wall covered with the device according to the disclosed embodiment. As can be seen in the figure, although it is less effective than the prior art devices (curve 102), the device according to the disclosed embodiment enables the equivalent surface of the wall to be reduced to a very considerable degree. It therefore enables the level of nuisance caused by the reflection of undesired radio waves to be reduced to a sufficient extent, while advantageously having much smaller overall dimensions than those of the prior art devices, making this device, in particular, less bulky and easier to install.

The invention claimed is:

1. A diffraction device for fitting to the facade of a building, or any other reflecting wall, exposed to an electromagnetic radiation transmitted by a source located at a distance from the building, the diffraction device comprising:
   a plurality of tubular resonant elements positioned on the facade of said building, wherein, these resonant elements being positioned in a substantially parallel way on the facade of said building, so as to form a diffraction grating of the Bragg grating type, and being oriented in a direction substantially perpendicular to the plane defined by the propagation vectors of the incident and reflected electromagnetic waves, each resonant element is formed by a tube of conductive material whose wall defines an inner cavity, and is configured to form a resonator of the "LC" type adapted to re-radiate a wave corresponding to the incident wave subjected to a phase shift; and
   the assembly of the resonant elements being arranged in such a way that the incident wave is diffracted in a preferred direction.

2. The device as claimed in claim 1, wherein a spacing pitch d of the different conductive elements is determined as a function of a wave-length $\lambda$ and an angle of incidence $\theta$ so as to create a Bragg grating producing a phase shift of the incident wave such that the latter is diffracted in a preferred direction.

3. The device as claimed in claim 2, wherein. if the electromagnetic transmission source is located inside the Fraunhofer zone, the spacing d between the different conductive elements is constant.

4. The device as claimed in claim 2, wherein if the electromagnetic transmission source is located outside the Fraunhofer zone, the spacing d between the different conductive elements is a function of the local angle of incidence of the electromagnetic wave.

5. The device as claimed in claim 1, wherein each resonant element has a longitudinal opening in its wall, the dimensions and geometry of the cavity defined by the wall, as well as the width of the longitudinal opening formed in this wall, being defined so that the element acts, in electromagnetic terms, as an LC resonator with a resonance frequency F0 and a bandwidth $\Delta$F0.

6. The device as claimed in claim 1, wherein each resonant element is configured so as to have overall dimensions which can be inscribed within a parallelepipedal volume of given dimensions defined with allowance for mechanical stresses.

7. The device as claimed in claim 6, wherein a wall of a resonant element has, in cross section, the shape of a rectangle, one of the lengths of which has a discontinuity corresponding to the longitudinal slit formed along the wall.

8. The device as claimed in claim 5, wherein the cavity defined by the wall of the resonant element accommodates an inner extension fixed to the inner face of said wall and forming a rib having a "T" shape in cross section, a bar of which is parallel to the lengths of the rectangle, the rib being configured and arranged within the cavity in such a way that the bar of the "T" is placed facing the opening present in one of the lengths of the rectangle, at a distance defined as a function. of the frequency $F0$ and the bandwidth $\Delta F0$.

9. The device as claimed. in claim 6, wherein the wall of a resonant element has the shape, in cross section, of a rectangle, one length of which has a discontinuity limited by two segments substantially perpendicular to said length, whose ends are directed toward the inside of the perimeter.

10. The device as claimed in claim 5, wherein cavities defined by the walls of the resonant elements are filled with a dielectric material chosen so as to reinforce the rigidity of the elements.

11. The device as claimed in claim S., wherein. cavities defined by the walls of the resonant elements are filled with two superimposed layers of a dielectric material chosen. so as to reinforce the rigidity of the elements, a conductive strip being placed in each cavity at the interface between the two layers, facing the longitudinal opening formed along the wall.

12. The device as claimed in claim 5, wherein. cavities defined by the walla of the resonant elements are filled with a nonconducting ferromagnetic material chosen so as to increase the bandwidth $\Delta F0$ and re-duce the frequency $F0$ of these elements.

13. The device as claimed in claim 5, wherein cavities defined by the walls of the resonant elements are filled with a dielectric material having a high permittivity $\in$, chosen so as to reduce the resonance frequency $F0$ of the elements.

14. A diffraction device for fitting to a facade of a building, or any other partition, exposed to the electromagnetic radiation transmitted by a distant source, comprising a plurality of tubular resonant elements positioned in a periodic manner in a substantially parallel way on the facade of said building so as to form a diffraction grating, each resonant element being itself formed by a plurality of juxtaposed resonant elements as claimed in claim 1, lateral walls of which are in electrical contact.

* * * * *

UNITED STATES PATENT AND TRADEMARK OFFICE
CERTIFICATE OF CORRECTION

PATENT NO. : 9,507,063 B2  Page 1 of 1
APPLICATION NO. : 14/362149
DATED : November 29, 2016
INVENTOR(S) : Thain et al.

It is certified that error appears in the above-identified patent and that said Letters Patent is hereby corrected as shown below:

In the Claims

Claim 12, Column 10, Line 5, delete "walla" and insert --walls-- therefor.

Claim 13, Column 10, Line 11, delete "$\epsilon$" and insert --ε-- therefor.

Signed and Sealed this
Twenty-eighth Day of March, 2017

Michelle K. Lee
*Director of the United States Patent and Trademark Office*